United States Patent
Baek

(10) Patent No.: US 10,817,974 B2
(45) Date of Patent: Oct. 27, 2020

(54) MEMORY DEVICE AND MEMORY SYSTEM INCLUDING THE SAME

(71) Applicant: SAMSUNG ELECTRONICS CO., LTD., Suwon-si (KR)

(72) Inventor: Byung-joon Baek, Goyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 6 days.

(21) Appl. No.: 15/962,754

(22) Filed: Apr. 25, 2018

(65) Prior Publication Data
US 2019/0087932 A1    Mar. 21, 2019

(30) Foreign Application Priority Data
Sep. 15, 2017    (KR) .......... 10-2017-0118841

(51) Int. Cl.
| | |
|---|---|
| *G06T 1/60* | (2006.01) |
| *G06F 3/06* | (2006.01) |
| *H04N 1/00* | (2006.01) |
| *G11C 8/06* | (2006.01) |
| *G11C 7/22* | (2006.01) |
| *G11C 7/10* | (2006.01) |

(Continued)

(52) U.S. Cl.
CPC .............. *G06T 1/60* (2013.01); *G06F 3/061* (2013.01); *G06F 3/0604* (2013.01); *G06F 3/0659* (2013.01); *G06F 3/0673* (2013.01); *G06F 3/0679* (2013.01); *G11C 7/1012* (2013.01); *G11C 7/12* (2013.01); *G11C 7/222* (2013.01); *G11C 8/06* (2013.01); *G11C 8/18* (2013.01); *H04N 1/00* (2013.01); *H04N 5/23229* (2013.01)

(58) Field of Classification Search
CPC .... G06T 1/60; G11C 7/12; G11C 8/18; G11C 8/06; G11C 7/222; G11C 7/1012; G06F 3/0659; G06F 3/0604; G06F 3/0673; G06F 13/1668; G06F 3/0658; H04N 5/23229; H04N 1/00
See application file for complete search history.

(56) References Cited

U.S. PATENT DOCUMENTS

| | | |
|---|---|---|
| 5,585,863 A | 12/1996 | Hackett et al. |
| 6,018,354 A | 1/2000 | Jones et al. |

(Continued)

OTHER PUBLICATIONS

Jacob, Bruce L., "Synchronous DRAM Architectures, Organizations, and Alternative Technologies", Dec. 10, 2002, Electrical & Computer Engineering Department, University of Maryland, 22 pages total.

(Continued)

*Primary Examiner* — Albert H Cutler
(74) *Attorney, Agent, or Firm* — Sughrue Mion, PLLC

(57) ABSTRACT

A memory device and a memory system including the same are provided. The memory device includes a memory cell array including memory cells, a control logic configured to output a control signal for data reading or data writing to the memory cell array, and a data streamer configured to perform a streaming operation for reading data from or writing data to the memory cell array in response to a streaming signal. The data streamer receives data size information of first data to be read or written and performs the streaming operation by outputting at least one streaming drive command to the control logic based on the data size information.

20 Claims, 15 Drawing Sheets

(51) Int. Cl.
*H04N 5/232* (2006.01)
*G11C 8/18* (2006.01)
*G11C 7/12* (2006.01)
*G06F 13/16* (2006.01)

(56) References Cited

U.S. PATENT DOCUMENTS

| | | | |
|---|---|---|---|
| 6,297,857 | B1 | 10/2001 | Jones et al. |
| 7,151,800 | B1* | 12/2006 | Luna .................... H04N 19/70 |
| | | | 375/240.23 |
| 7,557,843 | B2 | 7/2009 | Shizukuishi |
| 7,639,296 | B2 | 12/2009 | Mabuchi |
| 7,849,277 | B2 | 12/2010 | Matsutani |
| 7,903,075 | B2 | 3/2011 | Akimoto |
| 9,313,358 | B2 | 4/2016 | Suzuki |
| 9,521,348 | B2 | 12/2016 | Shen et al. |
| 9,591,170 | B2 | 3/2017 | Yaguchi |
| 2002/0012470 | A1* | 1/2002 | Luna .................... H04N 19/61 |
| | | | 382/233 |
| 2008/0044107 | A1 | 2/2008 | Horisaki |
| 2010/0115238 | A1* | 5/2010 | Tsao .................. G06F 15/8053 |
| | | | 712/205 |
| 2010/0198936 | A1* | 8/2010 | Burchard ............ G06F 13/1673 |
| | | | 709/212 |
| 2010/0257398 | A1* | 10/2010 | Alexander .......... G11C 7/1045 |
| | | | 713/500 |
| 2010/0287424 | A1 | 11/2010 | Kwon |
| 2011/0010494 | A1 | 1/2011 | Tanaka |
| 2012/0331337 | A1 | 12/2012 | Otsuka |
| 2013/0138875 | A1* | 5/2013 | Kamphenkel ....... G06F 12/0246 |
| | | | 711/103 |
| 2013/0272073 | A1* | 10/2013 | Hendrickson .......... G11C 7/109 |
| | | | 365/189.05 |
| 2015/0074337 | A1 | 3/2015 | Jo et al. |
| 2016/0267027 | A1* | 9/2016 | Fujisawa ............. G06F 13/1668 |
| 2016/0291872 | A1 | 10/2016 | Hashimoto et al. |
| 2017/0060479 | A1 | 3/2017 | Hong et al. |
| 2017/0075614 | A1 | 3/2017 | Kanno |
| 2017/0153825 | A1 | 6/2017 | Cho et al. |
| 2017/0255383 | A1 | 9/2017 | Chang et al. |
| 2018/0211707 | A1* | 7/2018 | Nosaka .................. G11C 16/08 |
| 2018/0276115 | A1* | 9/2018 | Shoji .................... G06F 12/0246 |
| 2018/0277227 | A1* | 9/2018 | Takizawa ............... G11C 16/10 |
| 2018/0309986 | A1* | 10/2018 | Edpalm .................... H04N 7/18 |

OTHER PUBLICATIONS

Communication dated Nov. 12, 2018, issued by the Intellectual Property Office of Singapore in counterpart Singapore Application No. 10201803737S.

* cited by examiner

MEMORY DEVICE AND MEMORY SYSTEM INCLUDING THE SAME

CROSS-REFERENCE TO RELATED APPLICATION

This application claims priority from Korean Patent Application No. 10-2017-0118841, filed on Sep. 15, 2017 in the Korean Intellectual Property Office, the disclosure of which is incorporated by reference herein in its entirety.

BACKGROUND

Apparatuses, systems, and devices consistent with the present disclosure relate to a memory device and a memory system including the same, and more particularly, to a memory device for performing data streaming and a memory system including the memory device.

Semiconductor memory devices are memory devices implemented using semiconductors such as silicon (Si), germanium (Ge), gallium arsenide (GaAs), or indium phosphide (InP). Semiconductor memory devices may be divided into volatile memory devices and nonvolatile memory devices.

Nonvolatile memory devices retain data stored therein even when power is cut off. Nonvolatile memory devices may include NAND flash memory (NAND), vertical NAND (VNAND), NOR flash memory, resistive random access memory (RRAM), phase-change RAM (PRAM), and magnetoresistive RAM (MRAM).

Volatile memory devices lose data stored therein when power is cut off. Volatile memory devices may include static RAM (SRAM), dynamic RAM (DRAM), a latch, a flip-flop, and a register.

SUMMARY

One or more example embodiments provide a memory device for efficiently writing or reading data by automatically generating a command in response to a streaming signal from a memory controller.

One or more example embodiments also provide a memory system including a memory device for efficiently writing or reading data by automatically generating a command in response to a streaming command from a host.

According to an aspect of an example embodiment, there is provided a memory device including a memory cell array including a plurality of memory cells, a control logic configured to output a control signal for data reading or data writing to the memory cell array, and a data streamer configured to perform a streaming operation for reading data from or writing data to the memory cell array in response to a streaming signal. The data streamer may receive data size information of first data to be read or written and perform the streaming operation by outputting at least one streaming drive command to the control logic based on the data size information.

According to another aspect of another example embodiment, there is provided a memory system including a memory controller, and a memory device, wherein the memory controller comprises a streaming manager configured to output data size information of first data to the memory device when the first data is deterministic data of which a format and a size do not vary with an external command that is external to the memory controller, the first data being written to or read from the memory device; and the memory device comprises a data streamer configured to perform a streaming operation by internally generating, by the data streamer, at least one streaming drive command based on the data size information without intervention of the memory controller, the least one streaming drive command being for reading or writing the first data.

According to a further aspect of an example embodiment, there is provided an image processing apparatus including an image sensor comprising a plurality of pixels, the image sensor being configured to generate image data based on an optical signal applied to the plurality of pixels; a memory device; and a memory controller configured to receive the image data and to output data size information of the image data and a streaming signal to the memory device, and the memory device comprising a memory cell array configured to store the image data, a control logic configured to output a control signal for data reading or writing to the memory cell array, and a data streamer configured to receive the data size information, to generate internally, by the data streamer, at least one streaming drive command based on the data size information without intervention of the memory controller, and to output the at least one streaming drive command to the control logic so that the image data is written to the memory cell array.

BRIEF DESCRIPTION OF THE DRAWINGS

The above and/or other aspects will be more clearly understood from the following detailed description taken in conjunction with the accompanying drawings in which.

DETAILED DESCRIPTION

Hereinafter, example embodiments of the inventive concept will be described in detail with reference to the accompanying drawings.

Figure 1:
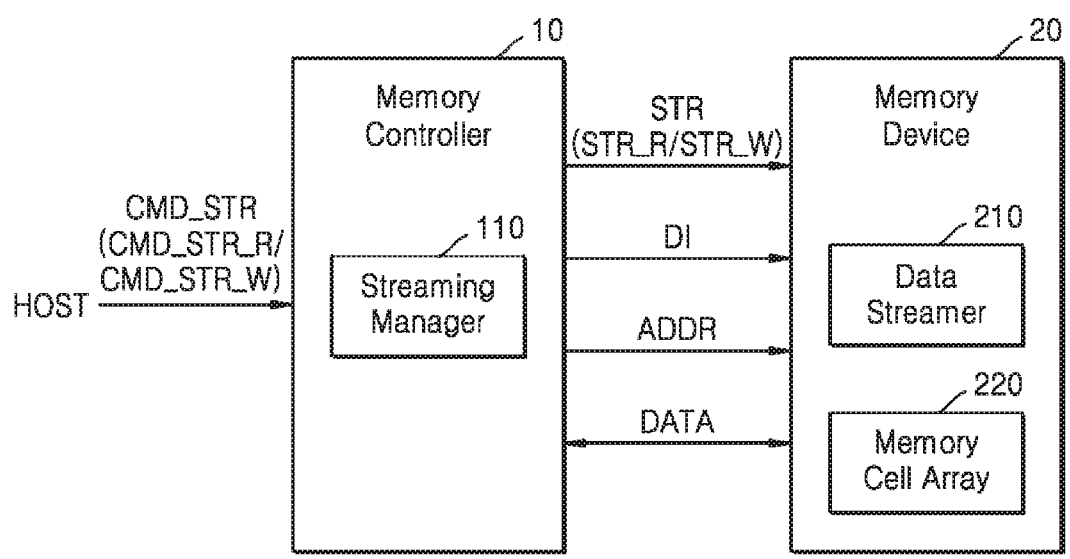
FIG. 1 is a block diagram of a memory system according to some example embodiments.

FIG. 1 is a block diagram of a memory system according to some example embodiments.

Referring to FIG. 1, a memory system 1 may include a memory controller 10 and a memory device 20.

The memory controller 10 may output various signals to the memory device 20 for controlling the memory device 20. The memory controller 10 may receive a streaming command CMD_STR from a host. The streaming command CMD_STR may include either a read streaming command CMD_STR_R for reading data from a memory cell array 220 or a write streaming command CMD_STR_W for writing data to the memory cell array 220. The read streaming command CMD_STR_R may include information about an address corresponding to a target of reading, information about data to be read, and a read command. The write streaming command CMD_STR_W may include information about data to be written and a write command.

When the format of data to be read or written from/to the memory device 20 is not changed by an external command that is external to the memory device 20 and the size of the data is fixed, the host may output the streaming command CMD_STR to the memory system 1. Hereinafter, data of which the format and size are already known and which is controllable while being transmitted without intervention of an external command is referred to as deterministic data. The deterministic data is not partially changed or read but rather is integrally read or written. The deterministic data may include multimedia data such as image data or video data.

According to some example embodiments, when the memory system 1 receives the streaming command CMD_STR, the memory device 20 may internally generate a streaming drive command by itself without intervention of the memory controller 10 and may write data to or read data from the memory cell array 220. Hereinafter, an operation in which the memory device 20 generates internally by itself a command for reading or writing data and performs data reading or writing is referred to as "data streaming". Data streaming may include write streaming for data writing and read streaming for data reading. The term "streaming drive command" used herein refers to a command generated by a data streamer 210 for data streaming and may include a row address strobe (RAS) signal, a column address strobe (CAS) signal, and a precharge signal. A normal drive command may be output from the memory controller 10 to the memory device 20 for data input/output in a normal mode. The term "normal mode" used herein refers to a mode that is not the streaming operation. The normal drive command may include a RAS signal, a CAS signal, and a precharge signal. The memory controller 10 may output a streaming signal STR and data information DI to the memory device 20 based on the streaming command CMD_STR. The streaming signal STR may be output to the memory device 20 through one pin among a command pin, an address pin, and another separate pin. The data information DI may be output as a separate signal or may be included in the streaming signal STR, a command, or an address. The memory device 20 may determine the types and the number of commands used for data input/output based on the data information DI received from the memory controller 10 and may control the memory cell array 220 to write or read data based on the determined commands. The data information DI may refer to the size of data to be written or read. For example, the memory device 20 may determine the number of RAS signals, the number of CAS signals, and the number of precharge signals based on the data information DI and may write or read data using the determined signals.

When the memory controller 10 receives a write command or a read command instead of the streaming command CMD_STR from the host, the memory controller 10 may output a plurality of normal drive commands to the memory device 20 so that a normal write operation or a normal read operation may be performed. The memory system 1 may simultaneously perform the normal mode in which a normal write operation or a normal read operation is performed in response to a write command or a read command from the host and the streaming mode in which a streaming operation is performed in response to the streaming command CMD_STR from the host. That is, the memory system 1 may simultaneously perform the normal mode and the streaming mode in parallel. This will be described with reference to FIG. 7 below.

The memory controller 10 may output an address ADDR and data DATA to the memory device 20 or may receive data DATA from the memory device 20. In detail, during a write operation, the memory controller 10 may output the address ADDR and data DATA to the memory device 20 so that the data DATA is written to the memory cell array 220. During a read operation, the memory controller 10 may output the address ADDR to the memory device 20 so that the data DATA is read from the memory cell array 220. The memory controller 10 may output a streaming address together with the streaming signal STR for performing data streaming during the data read operation. The streaming address may refer to at least one, for example, a first one, among a plurality of addresses at which the data has been stored. The address ADDR may be transmitted and received through an address pin and the data DATA may be transmitted and received through a data pin.

The memory controller 10 may include a streaming manager 110. The streaming manager 110 may receive the streaming command CMD_STR from the host and may output the streaming signal STR to the memory device 20 based on the streaming command CMD_STR. The streaming manager 110 may generate the data information DI based on the streaming command CMD_STR and may output the data information DI to the memory device 20. Since deterministic data is written and read integrally within the memory device 20, the type and the number of commands for a write or read operation may be determined by the size of the deterministic data. Accordingly, without intervention of the memory controller 10, the memory device 20 may determine internally by the memory device 20 the type and the number of commands for a write or read operation based on a data size included in the data information DI received from the memory controller 10.

The memory device 20 may store data and may include the data streamer 210 and the memory cell array 220. The memory device 20 may be a volatile memory device, such as dynamic random access memory (DRAM) (e.g., double data rate synchronous DRAM (DDR SDRAM), low power DDR (LPDDR) SDRAM, graphics DDR (GDDR) SDRAM, or Rambus DRAM (RDRAM)) or static RAM (SRAM), or a nonvolatile memory device, such as NAND flash memory (NAND), vertical NAND (VNAND), NOR flash memory, resistive RAM (RRAM), phase-change RAM (PRAM), magnetoresistive RAM (MRAM), ferroelectric RAM (FRAM), or spin-transfer torque RAM (STT-RAM).

The data streamer 210 may receive the streaming signal STR and the data information DI from the memory controller 10 and may perform data streaming. In other words, the data streamer 210 may generate various commands for writing or reading data to or from the memory cell array 220 in response to the streaming signal STR, without receiving a separate command from the memory controller 10. The data streamer 210 may determine a streaming drive command based on the data size information included in the data information DI and may write or read data using a plurality of determined commands.

The memory cell array 220 may include a plurality of memory cells that store data. The memory cells may be grouped into banks. This bank structure will be described in detail with reference to FIGS. 6A and 6B and other drawings below. Data may be written to or read from the memory cell array 220 by a data input/output operation in accordance with the data streaming of the data streamer 210.

Although the memory device 20 receives the data information DI and the streaming signal STR from the memory controller 10 in the example embodiments illustrated in FIG. 1, the inventive concept is not limited thereto. The memory device 20 may receive the data information DI and the streaming signal STR from outside the memory system 1 (e.g., from an application processor (AP) or a CMOS image sensor (CIS)) or may generate the data information DI and the streaming signal STR by itself internally within the memory device 20 in other example embodiments.

Figure 2:
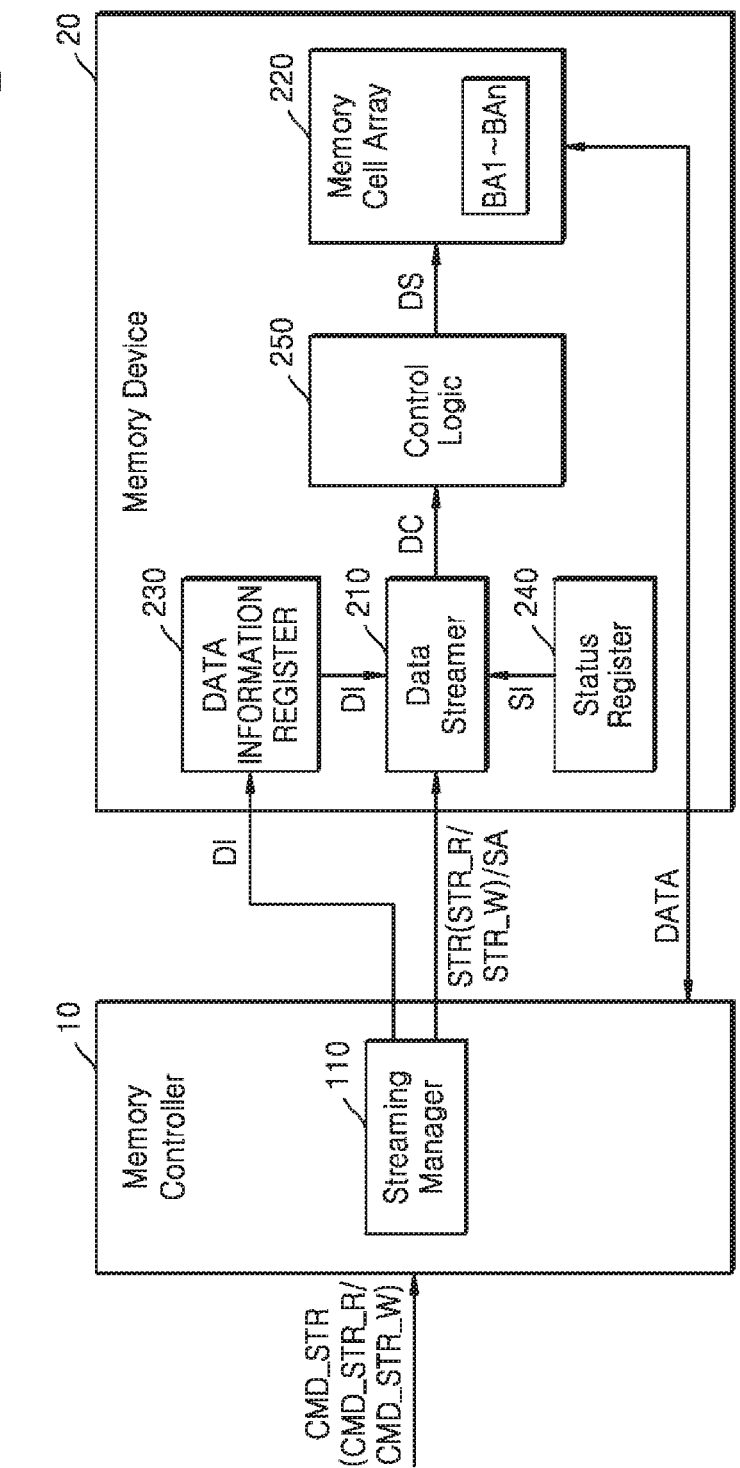
FIG. 2 is a block diagram of a memory system according to some example embodiments.

FIG. 2 is a block diagram of a memory system according to some example embodiments. Redundant descriptions that have been made with reference to FIG. 1 will be omitted for conciseness.

Referring to FIG. 2, the memory system 1 may include the memory controller 10 and the memory device 20. The memory controller 10 may include the streaming manager 110. The memory device 20 may include the data streamer 210, a data information register 230, a status register 240, a control logic 250, and the memory cell array 220.

The streaming manager 110 may generate the data information DI based on the streaming command CMD_STR received from a host. The streaming command CMD_STR may include data size information of first data to be written or read. The streaming manager 110 may decode the streaming command CMD_STR to generate the data information DI including the data size information and may store the data information DI in the data information register 230.

The streaming manager 110 may generate the streaming signal STR corresponding to the streaming command CMD_STR and may output the streaming signal STR to the data streamer 210. The streaming signal STR may include a write streaming signal STR_W corresponding to the write streaming command CMD_STR_W and a read streaming signal STR_R corresponding to the read streaming command CMD_STR_R.

The streaming manager 110 may also generate a streaming address SA in response to the streaming command CMD_STR and may output the streaming address SA to the data streamer 210. The streaming command CMD_STR may include information about the streaming address SA, and the streaming manager 110 may generate the streaming address SA based on the information. When the streaming command CMD_STR is the read streaming command CMD_STR_R, the streaming address SA may include an address at which the first data to be read has been stored. For example, the streaming address SA may be a start address among a plurality of addresses at which the first data has been stored.

In a read streaming operation corresponding to the read streaming signal STR_R, the data streamer 210 may determine at least one streaming drive command DC for reading based on the data information DI and may determine a read address corresponding to a target of reading based on the data information DI and the streaming address SA.

The data information register 230 may store the data information DI and may include at least one storage element. The at least one storage element may include volatile memory, such as SRAM, DRAM, a latch, a flip-flop, or a register, or nonvolatile memory, such as NAND, VNAND, NOR flash memory, RRAM, PRAM, MRAM, FRAM, or STT-RAM. The data information register 230 may output the data information DI to the data streamer 210.

The status register 240 may store status information SI of the memory cell array 220. The status information SI may include information about an available address for writing and may be periodically updated by the control logic 250. The status register 240 may include at least one storage element. The at least one storage element may include volatile memory, such as SRAM, DRAM, a latch, a flip-flop, or a register, or nonvolatile memory, such as NAND, VNAND, NOR flash memory, RRAM, PRAM, MRAM, FRAM, or STT-RAM. When the memory device 20 receives the write streaming signal STR_W, the status register 240 may output the status information SI to the data streamer 210.

In a write streaming operation corresponding to the write streaming signal STR_W, the data streamer 210 may determine at least one streaming drive command DC for writing based on the data information DI and the status information SI. In detail, the data streamer 210 may determine the type and the number of streaming drive commands DC based on data size information included in the data information DI, and may assign an available address as a write address based on the status information SI. The data streamer 210 may include command number calculation logic or a command calculation table to determine the type and the number of the at least one streaming drive command.

The data streamer 210 may output the number of the at least one streaming drive command DC that has been determined to the control logic 250. The control logic 250 may output a drive signal DS to the memory cell array 220 based on the number of the at least one streaming drive command DC, and the memory cell array 220 may output data to the memory controller 10 in response to the drive signal DS. The memory cell array 220 may include first through N-th banks BA1 through BAn, as described with reference to FIGS. 6A and 6B below.

Figure 3:
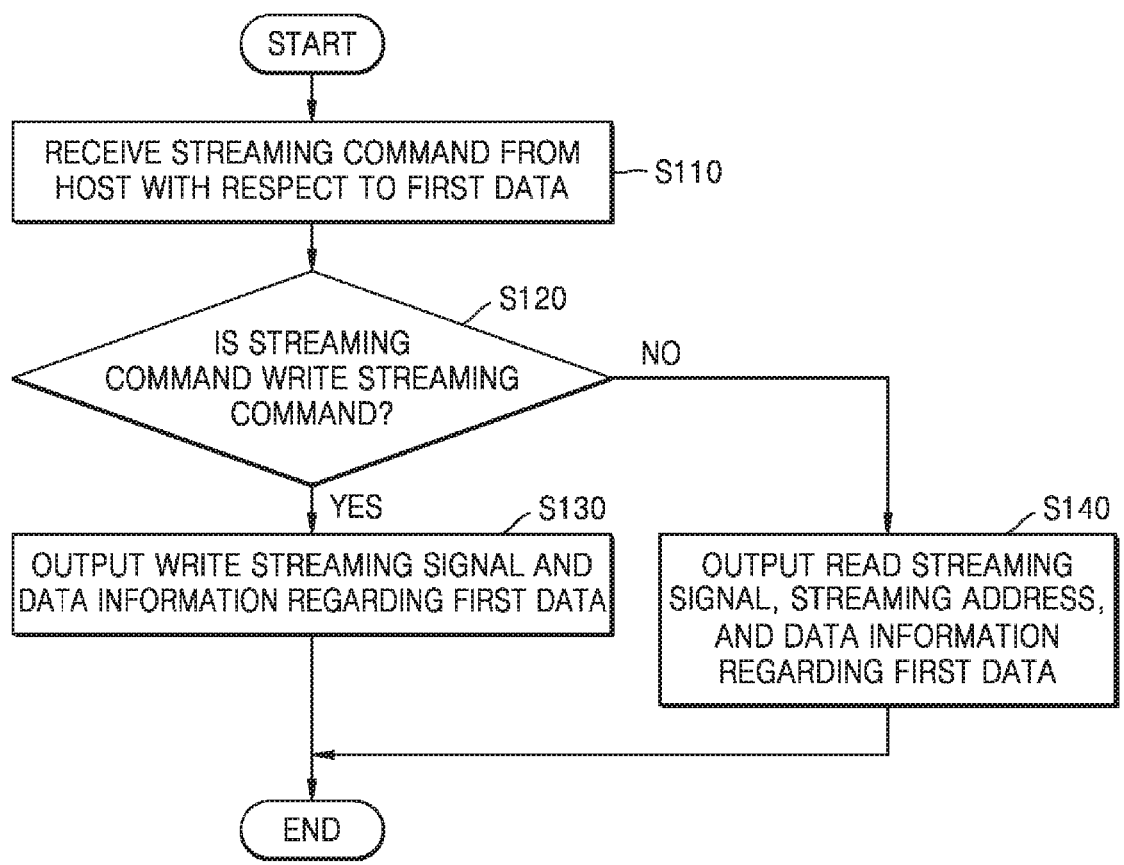
FIG. 3 is a flowchart of an operation of a memory controller, according to some example embodiments.

FIG. 3 is a flowchart of the operation of a memory controller, according to some example embodiments.

Referring to FIGS. 2 and 3, the memory controller 10 may receive the streaming command CMD_STR from a host with respect to first data in operation S110. The streaming command CMD_STR may include the write streaming command CMD_STR_W for writing the first data to the memory cell array 220 or the read streaming command CMD_STR_R for reading the first data from the memory cell array 220. It is determined whether the streaming command CMD_STR is the write streaming command CMD_STR_W in operation S120. When the streaming command CMD_STR is determined to be the write streaming command CMD_STR_W (operation S120, YES), the memory controller 10 may output the write streaming signal STR_W and the data information DI regarding the first data to the memory device 20 in operation S130. When the streaming command CMD_STR is determined to be the read streaming command CMD_STR_R (i.e., not the write streaming command CMD_STR_W) (operation S120, NO), the memory controller 10 may output the read streaming signal STR_R, the streaming address SA, and the data information DI regarding the first data to the memory device 20 in operation S140.

Figure 4A:
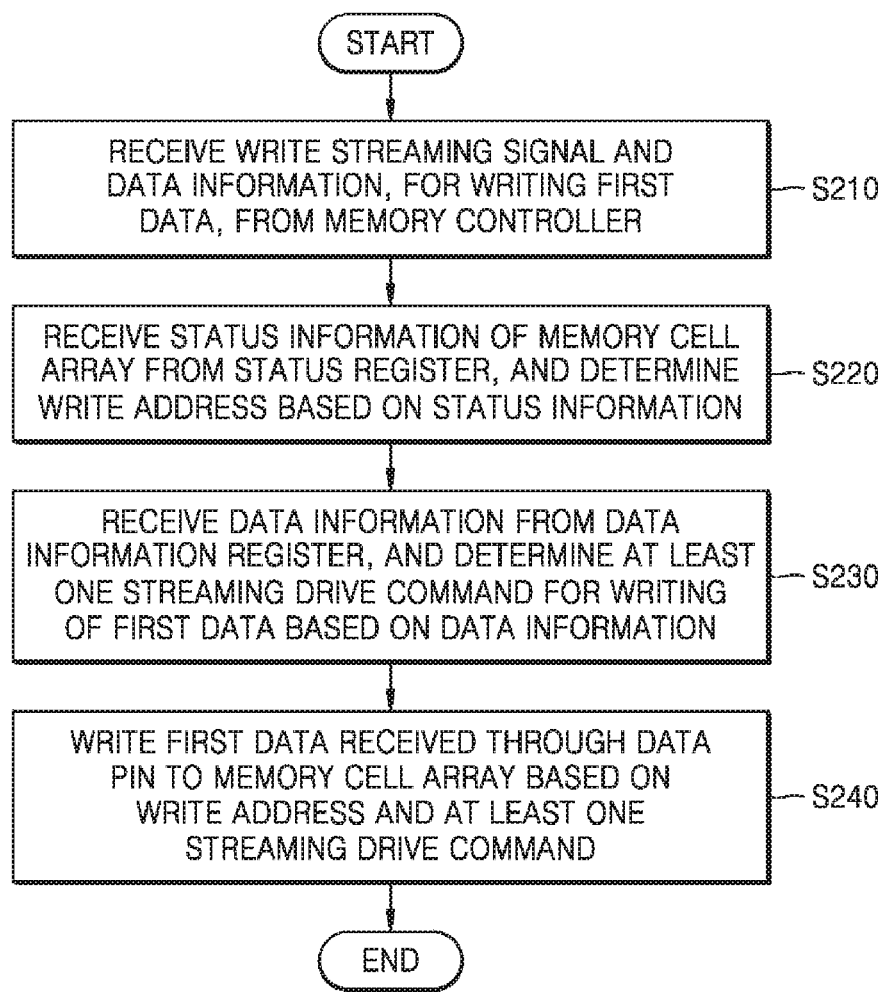
FIG. 4A is a flowchart of an operation of a memory device, according to some example embodiments.

FIG. 4A is a flowchart of the operation of a memory device, according to some example embodiments. In detail, FIG. 4A is a flowchart of the operation of the memory device 20 when write streaming is performed in response to the write streaming signal STR_W.

Referring to FIGS. 2 and 4A, for writing of first data, the memory device 20 may receive the write streaming signal STR_W and the data information DI from the memory controller 10 in operation S210. For example, the received information in operation S210 may correspond to the information output in operation S130 of FIG. 3. The first data may be deterministic data (e.g., image data). The data streamer 210 may receive the status information SI of the memory cell array 220 from the status register 240 and may determine a write address for the first data based on the status information SI in operation S220. The data streamer 210 may determine, as the write address, an address at which no data is stored.

The data streamer 210 may receive the data information DI from the data information register 230 and determine at least one streaming drive command DC for writing of the first data based on the data information DI in operation S230. At this time, the data streamer 210 may calculate the number of streaming drive commands DC based on data size information included in the data information DI.

The data streamer 210 may output the at least one streaming drive command DC to the control logic 250, and the control logic 250 may output the drive signal DS to the memory cell array 220 based on the at least one streaming drive command DC, so that the first data received through a data pin (DQ in FIG. 5) may be written to the memory cell array 220 in operation S240.

Figure 4B:
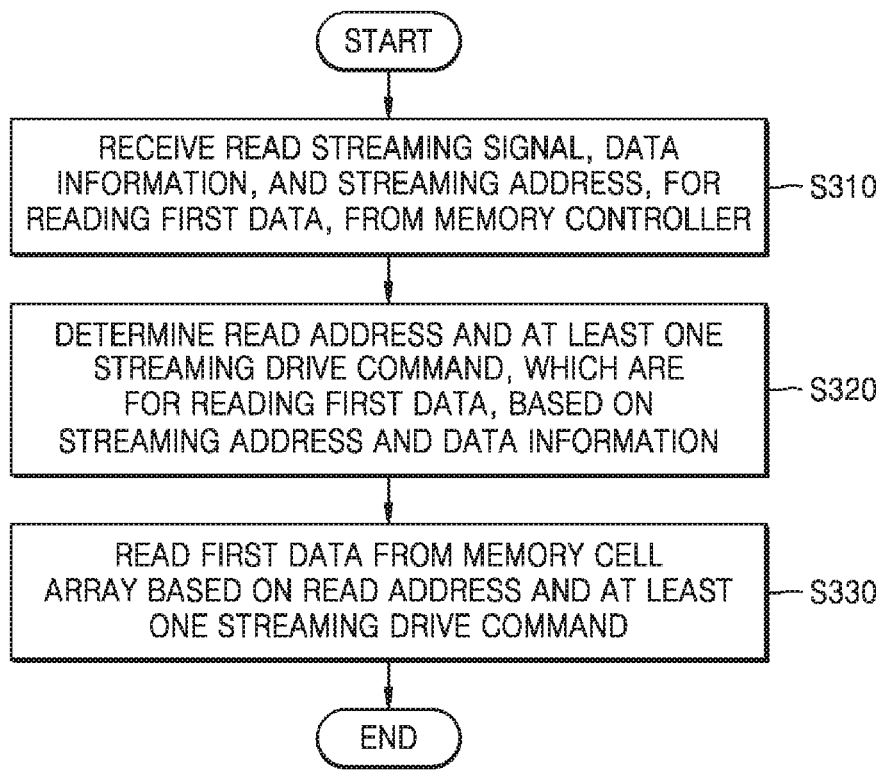
FIG. 4B is a flowchart of an operation of a memory device, according to some example embodiments.

FIG. 4B is a flowchart of the operation of a memory device, according to some example embodiments. In detail, FIG. 4B is a flowchart of the operation of the memory device 20 when read streaming is performed in response to the read streaming signal STR_R.

Referring to FIGS. 2 and 4B, for reading of first data, the memory device 20 may receive the read streaming signal STR_R, the data information DI, and the streaming address SA from the memory controller 10 in operation S310. The first data may be deterministic data. The data streamer 210 may determine at least one streaming drive command DC and a read address, which are for reading the first data, based on the data information DI and the streaming address SA in operation S320. The streaming address SA may be the first one of a plurality of addresses at which the first data has been stored, and the data streamer 210 may determine the type and the number of streaming drive commands DC based on data size information included in the data information DI and determine the read address based on the streaming address SA.

The first data may be read from the memory cell array based on the read address and the at least one streaming drive command DC in operation S330. More specifically, the data streamer 210 may output the at least one streaming drive command DC to the control logic 250, and the control logic 250 may output the drive signal DS to the memory cell array 220, so that the first data may be read from the memory cell array 220.

Figure 5:
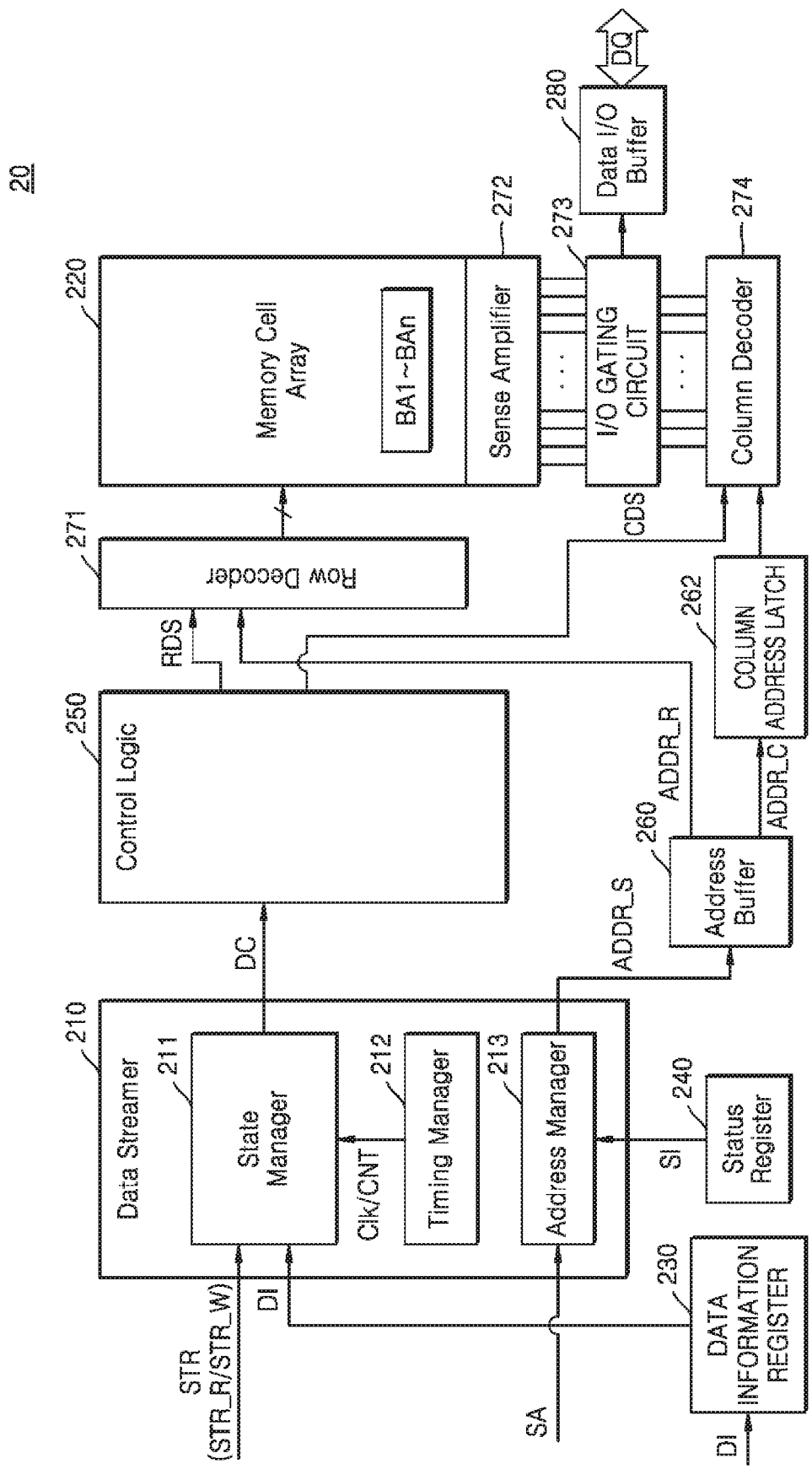
FIG. 5 is a block diagram of a memory device according to some example embodiments.

FIG. 5 is a block diagram of a memory device according to some example embodiments. Redundant descriptions that have been made with reference to FIG. 2 will be omitted for conciseness.

Referring to FIGS. 2 and 5, the memory device 20 may include the data streamer 210, the memory cell array 220, the data information register 230, the status register 240, the control logic 250, an address buffer 260, a column address latch 262, a row decoder 271, a sense amplifier 272, an input/output (I/O) gating circuit 273, a column decoder 274, and a data input/output (I/O) buffer 280.

The memory device 20 may be a volatile memory device implemented as DRAM, such as DDR SDRAM, LPDDR SDRAM, GDDR SDRAM, or RDRAM, in the example embodiments illustrated in FIG. 5, but the inventive concept is not limited thereto.

The data streamer 210 may include a state manager 211, a timing manager 212, and an address manager 213. The state manager 211 may receive the streaming signal STR from the memory controller 10, may generate the streaming drive command DC in response to the streaming signal STR, and may output the streaming drive command DC to the control logic 250. For example, the state manager 211 may generate the streaming drive command DC based on the streaming signal STR and the data information DI from the data information register 230, and may output the streaming drive command DC to the control logic 250. The streaming signal STR may be included in a mode setting signal for setting a mode register (not shown) when the streaming signal STR is output to the memory device 20. The state manager 211 may receive the data information DI from the data information register 230 and may determine the at least one streaming drive command DC, which is for processing deterministic data, based on the data information DI. For example, the state manager 211 may determine the number of streaming drive commands DC, e.g., the number of RAS signals, the number of CAS signals, and the number of precharge signals, based on the data information DI.

The timing manager 212 may control output timing of the at least one streaming drive command DC. The timing manager 212 may output a clock signal Clk and/or a counting signal CNT to the state manager 211 to control the output timing of the at least one streaming drive command DC. The clock signal Clk may determine an output timing of various signals of the state manager 211, and the counting signal CNT may be used to count the number of the at least one streaming drive command DC.

When the state manager 211 receives the write streaming signal STR_W, the address manager 213 may assign an available address as a write address based on the status information SI of the memory cell array 220, which has been received from the status register 240. The address manager 213 may determine an address, at which no data is stored, as the write address. Alternatively, the address manager 213 may determine an address at which no valid data is stored as the write address. The address at which no valid data is stored may be an address at which invalid data is stored. The address manager 213 may store the write address in the address buffer 260 as a streaming address ADDR_S. When the state manager 211 receives the read streaming signal STR_R, the address manager 213 may determine a read address based on the streaming address SA received from the memory controller 10. Alternatively, the address manager 213 may receive the data information DI and may determine a read address based on the data information DI. The address manager 213 may store the read address in the address buffer 260 as the streaming address ADDR_S.

The control logic 250 may control the operation of the memory device 20. For example, the control logic 250 may generate control signals for controlling the memory device 20 to perform a write operation or a read operation.

The address buffer 260 may receive the streaming address ADDR_S, which includes a row address ADDR_R and a column address ADDR_C, from the address manager 213.

The address buffer 260 may provide the row address ADDR_R to the row decoder 271 and the column address ADDR_C to the column address latch 262. The row decoder 271 may decode a row address and may activate a word line corresponding to the row address. For example, the row decoder 271 may apply a word line driving voltage to the word line corresponding to the row address.

The column address latch 262 may receive the column address ADDR_C from the address buffer 260 and may temporarily store the column address ADDR_C. The column address latch 262 may gradually increase the column address ADDR_C in a burst mode. The column address latch 262 may apply the column address ADDR_C, which has been temporarily stored or gradually increased, to the column decoder 274.

The column decoder 274 may activate the sense amplifier 272 corresponding to the column address ADDR_C through the I/O gating circuit 273. The I/O gating circuit 273 may include circuits which gate I/O data, an input data mask logic, read data latches which store data output from the memory cell array 220, and a write driver which writes data to the memory cell array 220.

Data to be read from the memory cell array 220 may be sensed and amplified by the sense amplifier 272 and may be stored in read data latches. The data stored in the read data latches may be provided to a memory controller through the data I/O buffer 280. Data to be written to the memory cell array 220 may be provided by the memory controller to the data I/O buffer 280. The data provided to the data I/O buffer 280 may be written to the memory cell array 220 through a write driver.

Figure 6A:
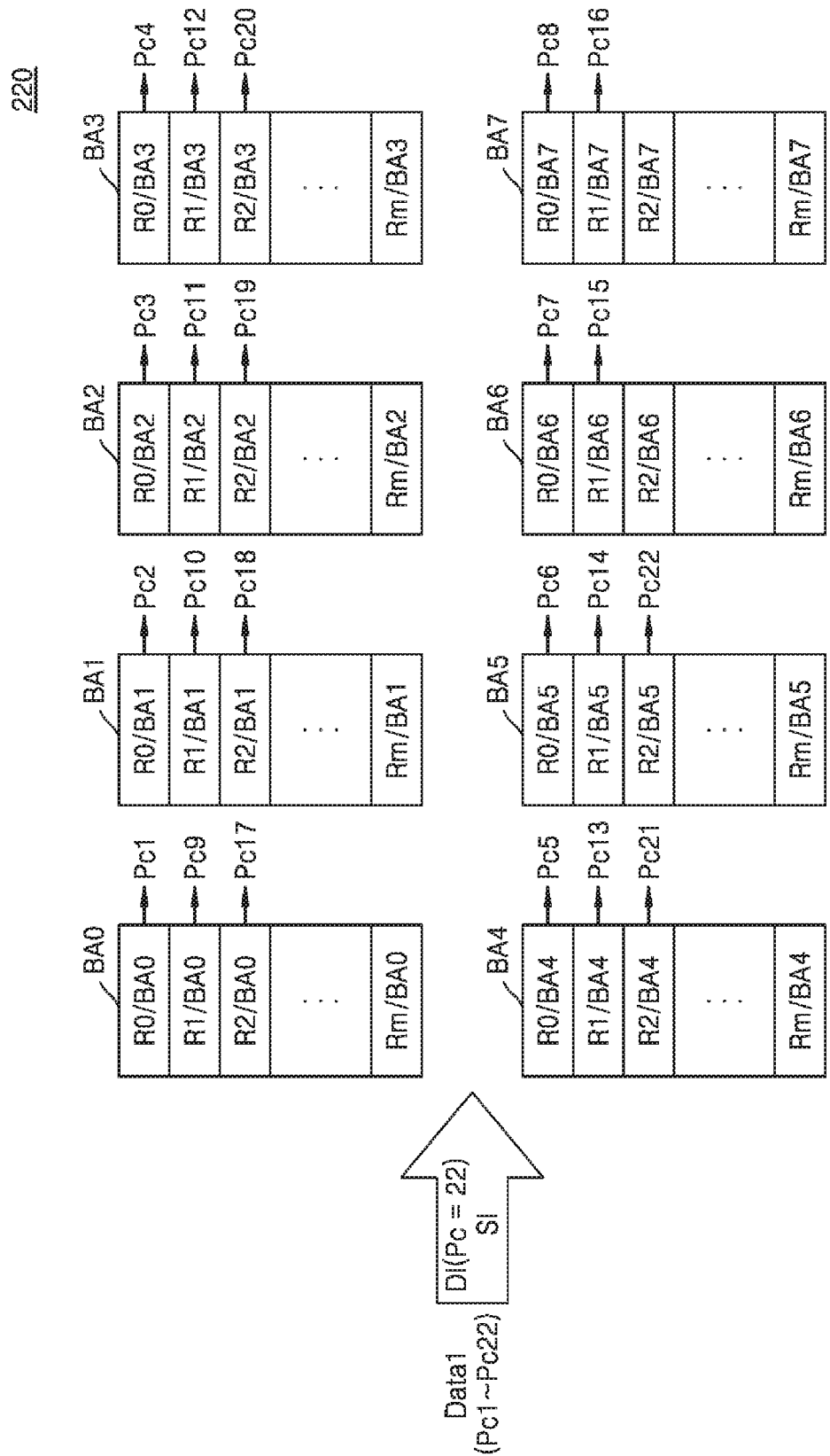
FIGS. 6A and 6B are each block diagrams of a memory cell array according to some example embodiments.
Figure 6B:
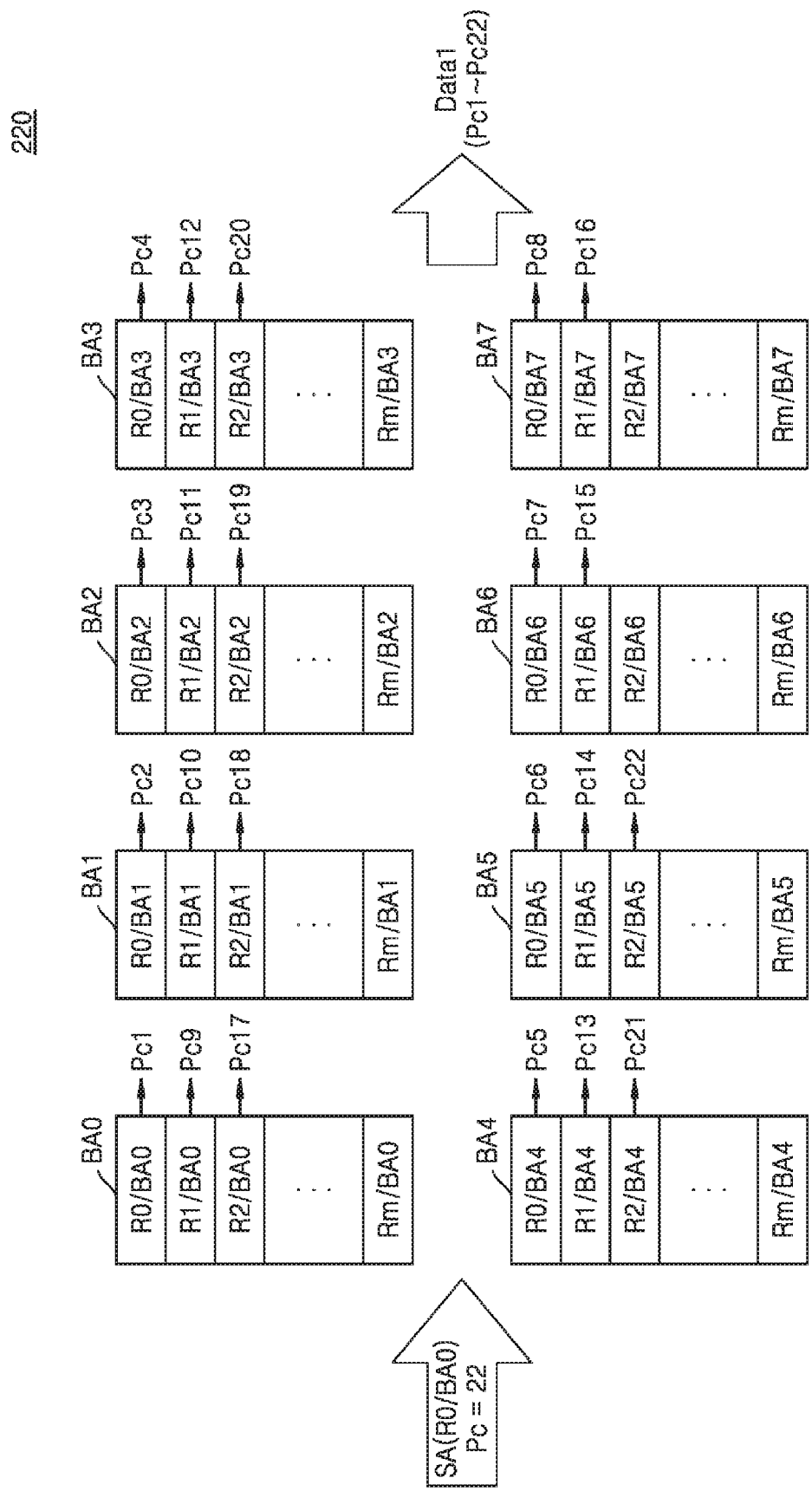

FIGS. 6A and 6B are each block diagrams of a memory cell array according to some example embodiments. In detail, FIG. 6A shows the memory cell array 220 when write streaming is performed with respect to first data Data1 and FIG. 6B shows the memory cell array 220 when read streaming is performed with respect to the first data Data1.

Referring to FIGS. 5 through 6B, the memory cell array 220 may include a first bank BA0, a second bank BA1, a third bank BA2, a fourth bank BA3, a fifth bank BA4, a sixth bank BA5, a seventh bank BA6, and an eighth bank BA7. Each of the first through eighth banks BA0 through BA7 may include a plurality of rows R0 through Rm. The rows R0 through Rm may be a group of memory cells sharing one word line in one bank. In other words, the rows R0 through Rm of the first bank BA0 share one word line, the rows R0 through Rm of the second bank BA1 share one word line, etc.

When the write streaming is performed in the example embodiment illustrated in FIG. 6A, the memory device 20 may receive the first data Data1 including first through 22nd pieces Pc1 through Pc22 of the first data. The state manager 211 may determine the number of pieces, i.e., a piece count Pc, as "22" based on the data information DI received from the data information register 230. The term "piece" as used herein refers to a data unit written to one row. The state manager 211 may determine the piece count Pc by dividing the size of the first data Data1 by the size of data written to one row. Alternatively, the state manager 211 may determine the piece count Pc based on a table stored separately. The state manager 211 may determine the number of RAS signals, the number of CAS signals, and the number of precharge signals based on the piece count Pc.

The address manager 213 may determine a write address so that the first data Data1 is sequentially written to rows in different banks. For example, the address manager 213 may receive "22" which is information about the piece count Pc from the state manager 211 as shown in FIG. 6A and may receive the status information SI of the memory cell array 220 from the status register 240. The status information SI may include information about available addresses. The address manager 213 may assign as many addresses as the piece count Pc among the available addresses as write addresses. The address manager 213 may store the write addresses in the address buffer 260. Referring to FIG. 6A, 22 addresses from R0/BA0 for the first row R0 in the first bank BA0 to R2/BA5 for the third row R2 in the sixth bank BA5 may be sequentially assigned as write addresses in the case where eight address banks are provided and the rows R0-R2 of each address bank are available. The first through 22nd pieces Pc1 through Pc22 may be sequentially written to the write addresses R0/BA0 through R2/BA5 based on driving signals RDS and CDS of the control logic 250. In some situations, one or more rows R0-Rm of one or more banks BA0-BA7 may be unavailable. In such a case, the addresses may be sequentially assigned while skipping the one or more unavailable rows. For example, if the third row R2 of the sixth bank BA5 is unavailable, the third row R2 of sixth bank BA5 may be skipped and the 22nd address may be assigned to the third row R2 of seventh bank BA6.

When the read streaming is performed in the example embodiment illustrated in FIG. 6B, the memory device 20 may receive the streaming address SA, i.e., R0/BA0, and the data information DI. The state manager 211 may determine the piece count Pc as "22" based on the data information DI received from the data information register 230, as discussed above with respect to FIG. 6A. The state manager 211 may determine the number of RAS signals, the number of CAS signals, and the number of precharge signals based on the piece count Pc.

The address manager 213 may determine a read address so that the first data Data1 is sequentially read from rows in different banks. For example, the address manager 213 may receive "22" which is information about the piece count Pc from the state manager 211 and may receive the streaming address SA, i.e., R0/BA0, from a memory controller, as shown in FIG. 6B. The streaming address SA may indicate a start address of the first data Data1 to be read. The address manager 213 may assign as many addresses starting from the streaming address SA as the piece count Pc as read addresses. In other words, in the example shown in FIG. 6B, the address manager 213 may assign 22 addresses starting from the streaming address R0/BA0. The address manager 213 may store the read addresses in the address buffer 260. Referring to FIG. 6B, 22 addresses from R0/BA0 for the first row R0 in the first bank BA0, followed by R0/BA1, followed by R0/BA2 through to R2/BA5 for the third row R2 in the sixth bank BA5 may be sequentially assigned as read addresses, as shown in FIG. 6B. The first through 22nd pieces Pc1 through Pc22 may be sequentially read from the read addresses R0/BA0 through R2/BA5 based on the driving signals RDS and CDS of the control logic 250 and may be output through the data pin DQ.

Figure 7:
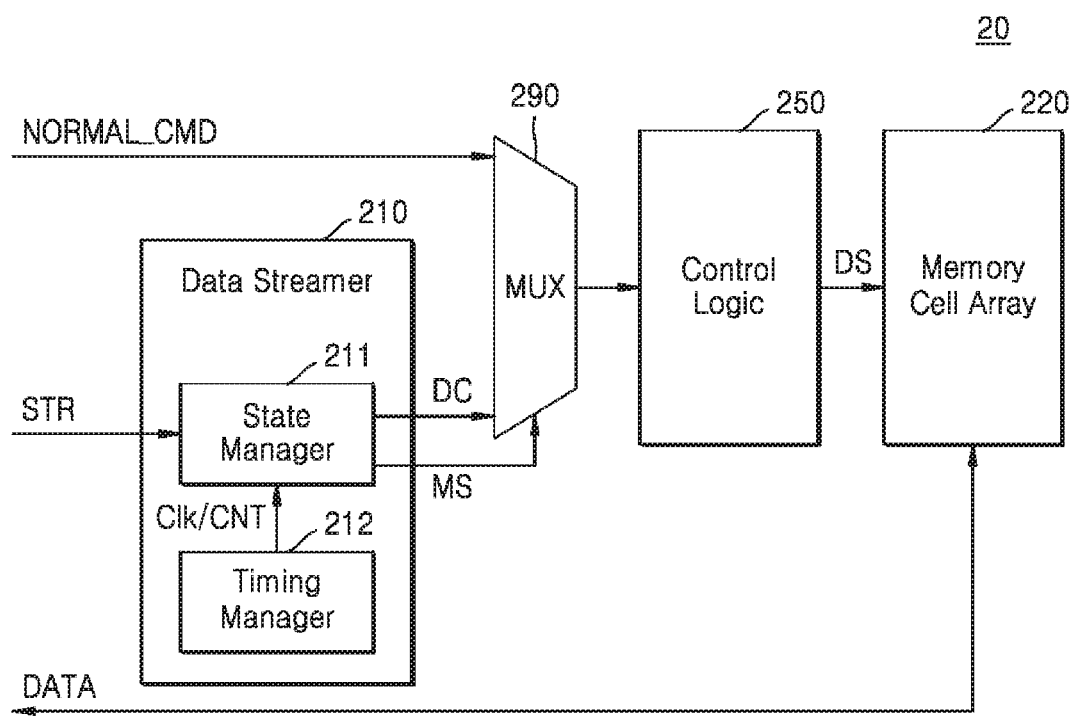
FIG. 7 is a block diagram of a memory device according to some example embodiments.

FIG. 7 is a block diagram of a memory device according to some example embodiments. Redundant descriptions that have been made with reference to FIGS. 2 and 5 will be omitted for conciseness.

Referring to FIG. 7, the memory device 20 may include the data streamer 210 including the state manager 211 and the timing manager 212, the memory cell array 220, the control logic 250, and a multiplexer (MUX) 290. The data streamer 210, the memory cell array 220, and the control logic 250 have been described above with reference to FIGS. 2 and 5, and thus repeated descriptions thereof will be omitted for conciseness.

The memory device 20 may receive a normal drive command NORMAL_CMD or the streaming signal STR from the memory controller 10. The normal drive command NORMAL_CMD may include commands for normal data I/O rather than for a streaming operation. The state manager 211 may output a mode selection signal MS to the MUX 290 in response to the streaming signal STR from the memory controller 10. The MUX 290 may selectively output the streaming drive command DC or the normal drive command NORMAL_CMD to the control logic 250 in response to the mode selection signal MS. When the data streamer 210 receives the streaming signal STR, the MUX 290 may output the at least one streaming drive command DC to the control logic 250 in response to a logic low of the mode selection signal MS. When the data streamer 210 does not receive the streaming signal STR, the MUX 290 may output the normal drive command NORMAL_CMD to the control logic 250 in response to a logic high of the mode selection signal MS. That is, when the data streamer 210 receives the streaming signal STR, the data streamer 210 outputs a logic low as the mode selection signal MS, and on the other hand, when the data streamer 210 does not receive the streaming signal STR, the data streamer 210 outputs a logic high as the mode selection signal MS.

Figure 8A:
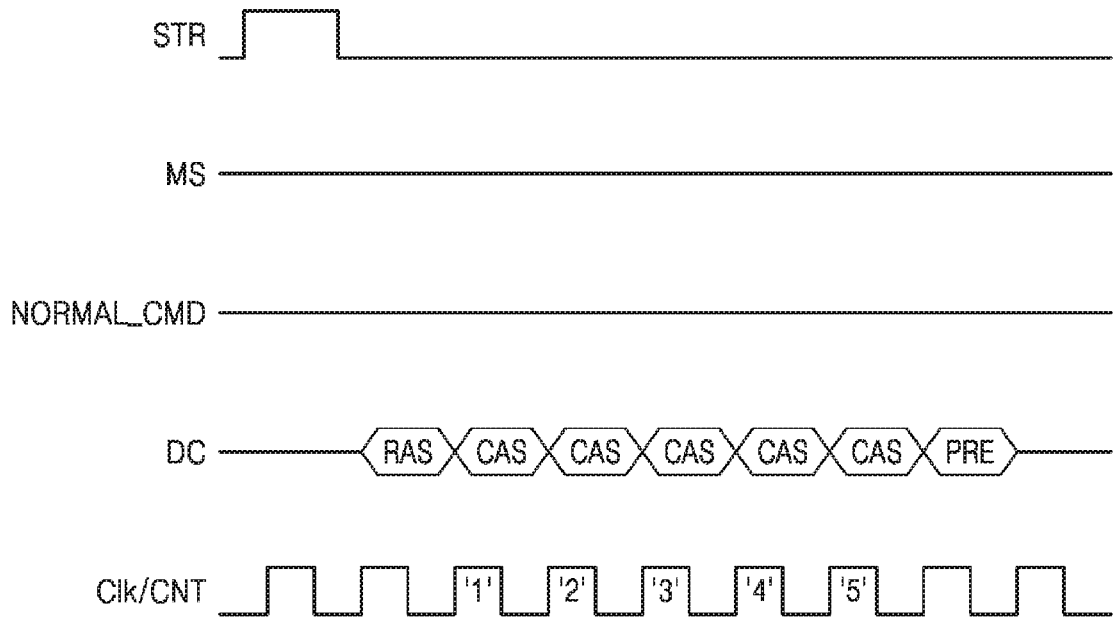
FIG. 8A is a timing diagram of an operation of a memory device, according to some example embodiments.

FIG. 8A is a timing diagram of an operation of a memory device, according to some example embodiments. In detail, FIG. 8A shows a streaming operation performed based on the at least one streaming drive command DC, according to some example embodiments.

Referring to FIGS. 7 and 8A, when the streaming signal STR transits to logic high, the data streamer 210 may determine the number and the type of the at least one streaming drive command DC based on data information and may output the at least one streaming drive command DC in the determined number to the control logic 250 according to a clock and counting signal Clk/CNT from the timing manager 212. For example shown in FIG. 8A, the data streamer 210 may determine the number of RAS signals RAS as one and the number of precharge signals PRE as one and the number of CAS signals CAS as five based on the data information and may output one RAS signal RAS, one precharge signal PRE, and five CAS signals CAS to the control logic 250 according to the clock and counting signal Clk/CNT. The data streamer 210 may output the RAS signal RAS, the CAS signals CAS, and the precharge signal PRE at the respective rising edges of the clock and counting signal Clk/CNT. After the RAS signal RAS is output, the counting signal CNT may be increased by "1" when each of the CAS signals CAS is output. After the five CAS signals CAS are output, the precharge signal PRE may be output. The mode selection signal MS remains logic low while the data streamer 210 is performing the streaming operation, so that the normal drive command NORMAL_CMD in not output but the streaming drive commands DC may be output to the control logic 250.

FIG. 8A shows one cycle corresponding to one RAS signal RAS. After the precharge signal PRE in FIG. 8A is output, another cycle of outputting a new RAS signal may be performed. Additional cycles may be output until data to be written is all written or data to be read is all read. The additional cycles may be the one cycle that is repeated, or may be different cycles. Although only CAS signals CAS are counted in the example illustrated in FIG. 8A, in other example embodiments the timing manager 212 may count all of the RAS signal RAS, the CAS signals CAS, and the precharge signal PRE until the streaming drive commands DC are all output.

Figure 8B:
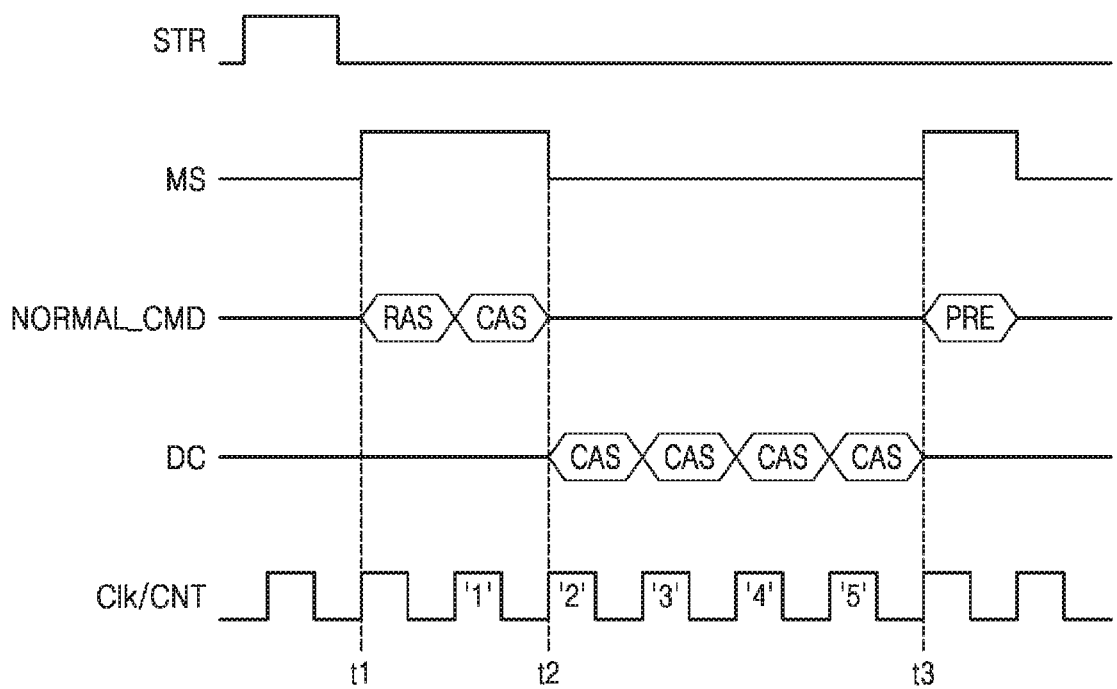
FIG. 8B is a timing diagram of an operation of a memory device, according to some example embodiments.

FIG. 8B is a timing diagram of an operation of a memory device, according to some example embodiments. In detail, FIG. 8B shows a streaming operation performed based on the normal drive command NORMAL_CMD and the at least one streaming drive command DC, according to some example embodiments.

Referring to FIGS. 7 and 8B, when the streaming signal STR transits to logic high, the data streamer 210 may determine the number and the type of the at least one streaming drive command DC based on data information. When the mode selection signal MS transits to logic high at time t1, the multiplexer 290 may receive the normal drive command NORMAL_CMD from the memory controller 10. At this time, the normal drive command NORMAL_CMD may include at least one signal among at least one RAS signal RAS, at least one CAS signal CAS, and at least one precharge signal PRE. The multiplexer 290 may output the at least one signal included in the normal drive command NORMAL_CMD to the control logic 250 according to a clock and counting signal Clk/CNT from the timing manager 212 while the mode selection signal MS is high. The data streamer 210 may output the at least one streaming drive command DC to the control logic 250 by outputting the mode selection signal MS transiting to logic low at time t2. The data streamer 210 may perform the streaming operation until the at least one streaming drive command DC are all output according to the clock and counting signal Clk/CNT. Then, the data streamer 210 may output the mode selection signal MS transiting to logic high at time t3.

In the example shown in FIG. 8B, the data streamer 210 may determine the number of RAS signals RAS as one and the number of precharge signals PRE as one and the number of CAS signals CAS as five based on the data information and may maintain the mode selection signal MS at logic high according to the clock and counting signal Clk/CNT until the counting signal CNT becomes "1". Accordingly, the RAS signal RAS and one CAS signal CAS may be output to the control logic 250 according to the normal drive command NORMAL_CMD. When the counting signal CNT becomes "1" at time t2, the data streamer 210 may output the mode selection signal MS transiting to logic low so that the remaining four CAS signals CAS are output to the control logic 250 according to the at least one streaming drive command DC. After all five CAS signals CAS are output to the control logic 250 at time t3, the data streamer 210 may output the mode selection signal MS transiting to logic high, so that the precharge signal PRE may be output to the control logic 250 according to the normal drive command NORMAL_CMD.

Figure 8C:
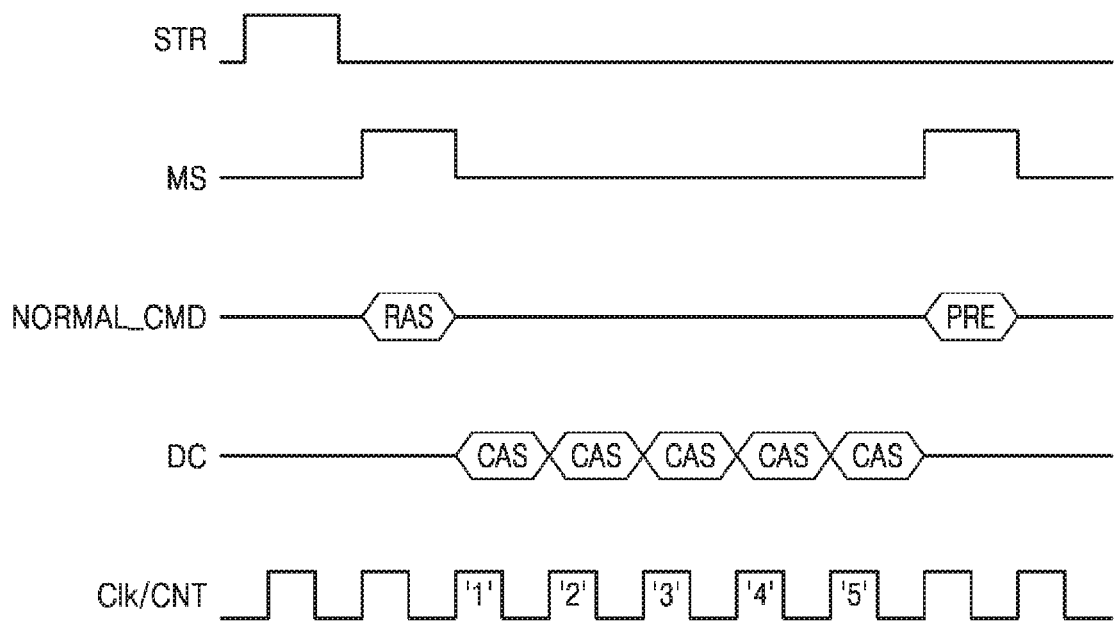
FIG. 8C is a timing diagram of an operation of a memory device, according to some example embodiments.

FIG. 8C is a timing diagram of an operation of a memory device, according to some example embodiments. In detail, FIG. 8C shows a streaming operation performed based on the normal drive command NORMAL_CMD and the at least one streaming drive command DC, according to other example embodiments.

Referring to FIGS. 7 and 8C, when the mode selection signal MS remains at logic high, the normal drive command NORMAL_CMD may be received from the memory controller 10. At this time, the normal drive command NORMAL_CMD may include at least one type of command among the RAS signal RAS, the CAS signal CAS, and the precharge signal PRE. When the streaming signal STR transits to logic high, the data streamer 210 may determine the number and the type of the at least one streaming drive command DC based on data information. The data streamer 210 may perform the streaming operation by outputting the mode selection signal MS transiting to logic low and maintaining the mode selection signal MS at logic low until a predetermined count value of the counting signal CNT is reached. Accordingly, the data streamer 210 may output to the control logic 250 as many of the at least one streaming drive command DC as the predetermined count value.

In the example illustrated in FIG. 8C, the memory device 20 may receive the RAS signal RAS according to the normal drive command NORMAL_CMD from the memory controller 10. After the RAS signal RAS is completely received, the memory device 20 may perform the streaming operation with respect to only the CAS signals CAS in response to the streaming signal STR from the memory controller 10. After the RAS signal RAS is completely received, the mode selection signal MS may transit to logic low. After the streaming operation of the CAS signals CAS is completed, the memory device 20 may receive the precharge signal PRE according to the normal drive command NORMAL_CMD from the memory controller.

In other words, according to the examples shown in FIGS. 8A, 8B and 8C, the RAS signal(s), the CAS signal(s) and the PRE signal(s) may be output either in the normal mode or in the streaming mode, and the mode may be changed during the outputting of the RAS signal(s), CAS signal(s), and PRE signal(s) such that one or more portions of the RAS signal(s), CAS signal(s), and PRE signal(s) are output in the normal mode and remaining portions of the RAS signal(s), CAS signal(s), and PRE signal(s) are output in the streaming mode. The mode may be changed according to the streaming signal STR.

Although it is illustrated in FIGS. 8A, 8B and 8C that a streaming operation starts as the streaming signal STR transits to logic high and the at least one streaming drive command DC is output to the control logic 250 when the mode selection signal MS is at logic low, this is just an example. It should be understood that the streaming operation alternatively may start as the streaming signal STR transits to logic low and the streaming drive command DC may be output to the control logic 250 when the mode selection signal MS is at logic high. Although it is illustrated in FIGS. 8A through 8C that the data streamer 210 outputs the RAS signal RAS, the CAS signals CAS, and the precharge signal PRE at the respective rising edges of the clock and counting signal Clk/CNT, this is just an example. The data streamer 210 may output the RAS signal RAS, the CAS signals CAS, and the precharge signal PRE at respective falling edges of the clock and counting signal Clk/CNT. Although it is illustrated in FIGS. 8A through 8C that there is one RAS signal RAS, one precharge signal PRE, and five CAS signals CAS, this is just an example. The number of RAS signals RAS, the number of the CAS signals CAS, and the number of the precharge signals PRE each may be changed.

Figure 9:
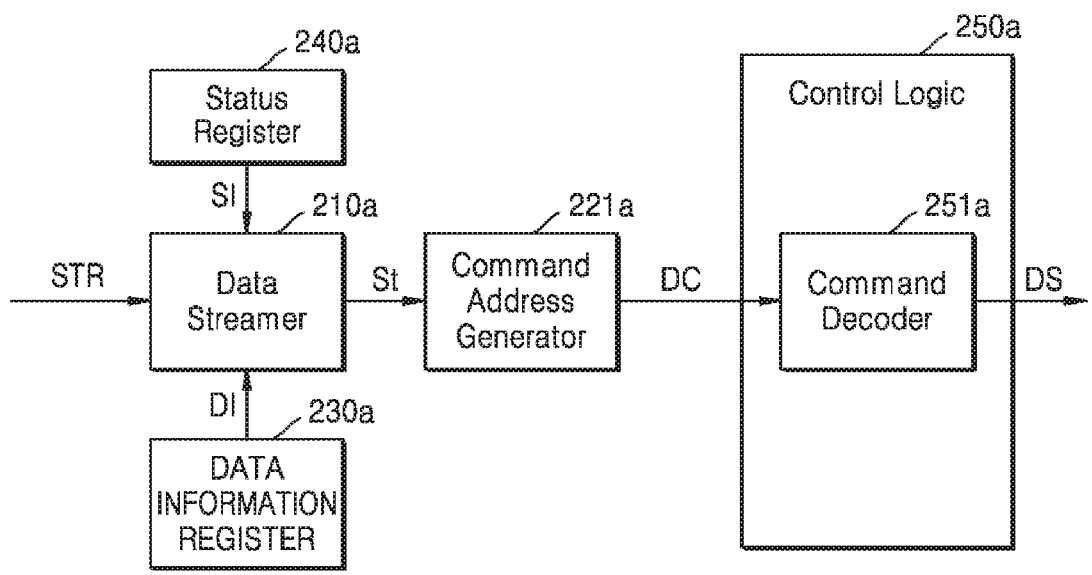
FIG. 9 is a block diagram of a memory device according to some example embodiments.

FIG. 9 is a block diagram of a memory device according to some example embodiments. Redundant descriptions that have been made with reference to FIG. 5 will be omitted for conciseness.

Referring to FIGS. 5 and 9, a memory device 20a may include a data streamer 210a, a command address generator 221a, a data information register 230a, a status register 240a, and a control logic 250a. The control logic 250a may include a command decoder 251a. The data information register 230a, the status register 240a, and the control logic 250a may be the same as or similar to the data information register 230, the status register 240, and the control logic 250, respectively, shown in FIG. 5, and thus repeated descriptions thereof will be omitted for conciseness.

The data streamer 210a may receive the status information SI of a memory cell array from the status register 240a and may receive the data information DI from the data information register 230a. The data streamer 210a may output a state signal St to the command address generator 221a based on the status information SI and the data information DI in response to the streaming signal STR from the memory controller 10. The state signal St may include information about a state of the memory device 20a. The state may be an initialize state, an active state, a read/write state, or a precharge state. The command address generator 221a may wait for command output in the initial state and may output a RAS signal as the at least one streaming drive command DC to the control logic 250a in the active state. The command address generator 221a may output a CAS signal as the at least one streaming drive command DC to the control logic 250a in the read/write state and may output a precharge signal to the control logic 250a in the precharge state. The data streamer 210a may output, to the command address generator 221a, "01" indicating the active state as the state signal St. The command address generator 221a may output a RAS signal as the at least one streaming drive command DC to the control logic 250a in response to the state signal St.

Figure 10A:
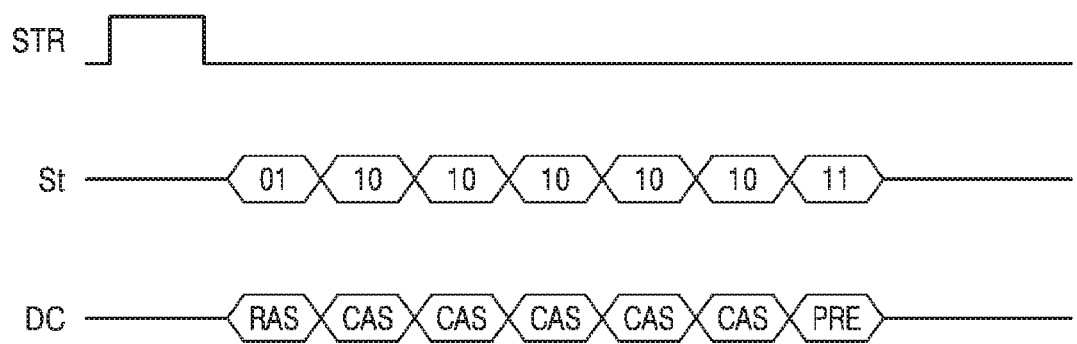
FIG. 10A is a timing diagram of an example operation of a memory device, according to some example embodiments.

FIG. 10A is a timing diagram of an operation of a memory device, according to some example embodiments.

Referring to FIGS. 9 and 10A, when the streaming signal STR transits to logic high, the data streamer 210a may determine the number and the type of the streaming drive commands DC based on data information and may output "01" as the state signal St to the command address generator 221a as many times as the number of RAS signals RAS. Here, the state signal St of "01" may indicate an active state. The command address generator 221a may output the RAS signal RAS to the control logic 250a in response to the state signal St of "01".

When the RAS signal RAS is all output, the data streamer 210a may output "10" as the state signal St to the command address generator 221a as many times as the number of CAS signals CAS. Here, the state signal St of "10" may indicate a read/write state. The command address generator 221a may output the CAS signal CAS to the control logic 250a in response to the state signal St of "10". When the CAS signals CAS are all output, the data streamer 210a may output "11" as the state signal St to the command address generator 221a as many times as the number of precharge signals PRE. Here, the state signal St of "11" may indicate a precharge state. The command address generator 221a may output the precharge signal PRE to the control logic 250a in response to the state signal St of "11".

Figure 10B:
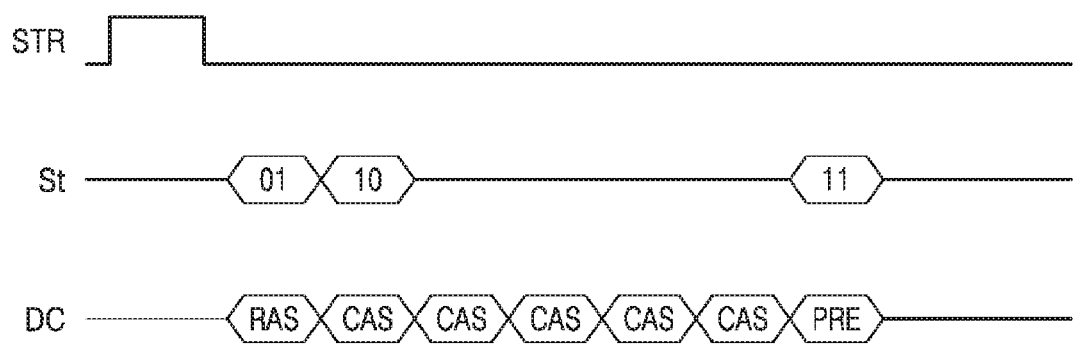
FIG. 10B is a timing diagram of an operation of a memory device, according to some example embodiments.

FIG. 10B is a timing diagram of an operation of a memory device, according to some example embodiments.

Referring to FIGS. 9 and 10B, when the streaming signal STR transits to logic high, the data streamer 210a may determine the number and the type of the streaming drive commands DC based on data information and may output "01" as the state signal St to the command address generator 221a. The command address generator 221a may output the RAS signal RAS to the control logic 250a in response to the state signal St of "01" until "10" is output as the state signal St.

When the RAS signal RAS is all output, the data streamer 210a may output "10" as the state signal St to the command address generator 221a. The command address generator 221a may output the CAS signal CAS to the control logic 250a in response to the state signal St of "10" and continue clocking out the CAS signal CAS until "11" is output as the state signal St. After the CAS signal CAS is all output, the data streamer 210a may output "11" as the state signal St to the command address generator 221a. The command address generator 221a may output the precharge signal PRE to the control logic 250a in response to the state signal St of "11". That is, in FIG. 10A, the state St is continued to be clocked out while the at least one streaming drive command DC is clocked out, while in FIG. 10B, the state St is only changed when the at least one streaming drive command DC changes among the RAS signal RAS, the CAS signal CAS, and the precharge signal PRE.

Figure 11:
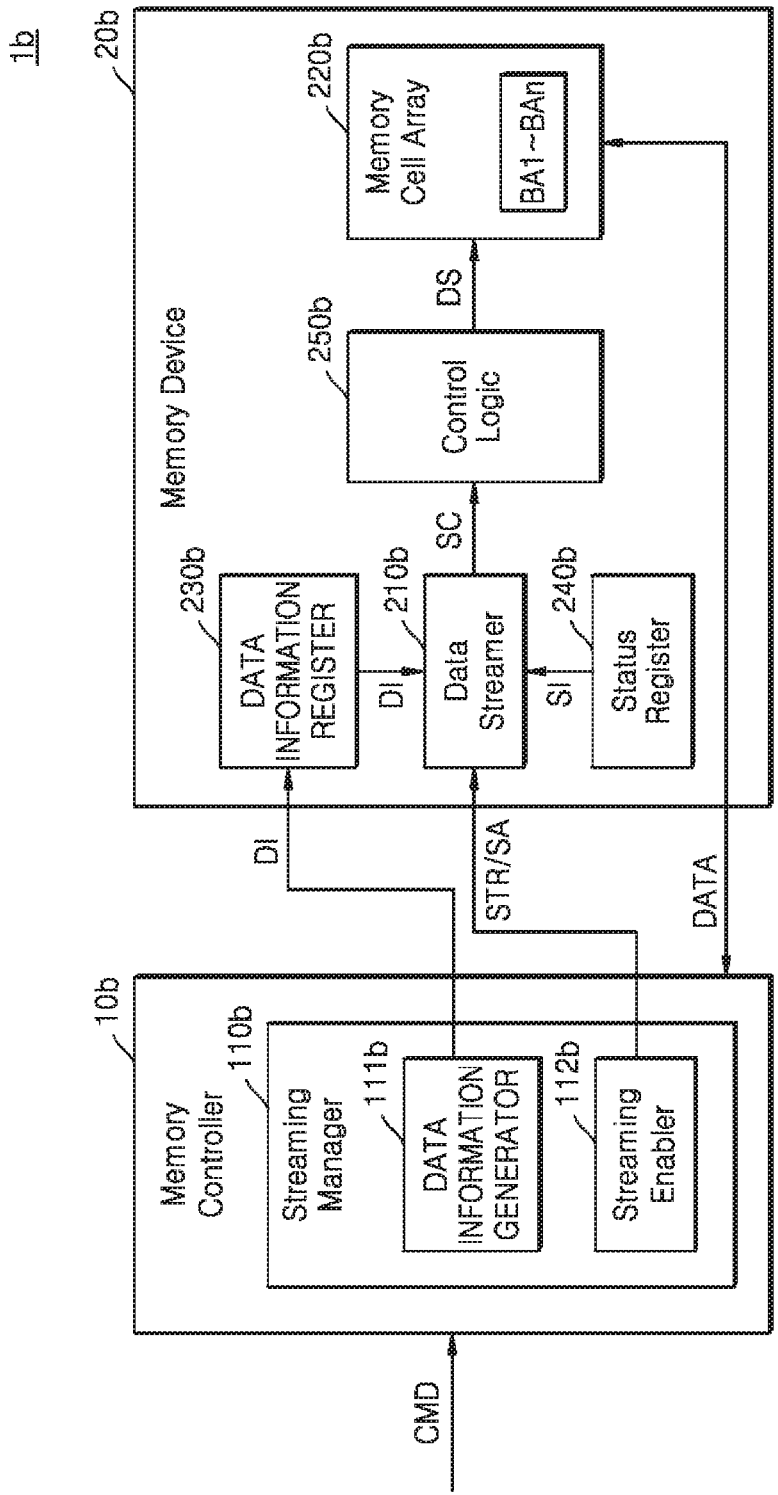
FIG. 11 is a block diagram of a memory system according to some example embodiments.

FIG. 11 is a block diagram of a memory system according to some example embodiments. Redundant descriptions that have been made with reference to FIG. 2 will be omitted for conciseness.

Referring to FIG. 11, a memory system 1b may include a memory controller 10b and a memory device 20b. The memory controller 10b may include a streaming manager 110b. The streaming manager 110b may include a data information generator 111b and a streaming enabler 112b. A command CMD may include data size information of first data to be read or written. The data information generator 111b may decode the command CMD to generate the data information DI including the data size information of the first data and may transmit the data information DI to a data information register 230b of the memory device 20b.

The streaming enabler 112b may generate the streaming signal STR based on the nature of the first data requested to be read or written by the command CMD and may output the streaming signal STR to a data streamer 210b. The streaming enabler 112b may generate the streaming signal STR when the first data is deterministic data. The streaming enabler 112b may determine whether the first data is deterministic data by decoding the command CMD and extracting nature information of the first data. The streaming enabler 112b may determine whether the first data is deterministic data based on header information of the command CMD or based on extension information of the first data. When the extension of the first data is for image data, the streaming enabler 112b may generate and output the streaming signal STR to the data streamer 210b of the memory device 20b.

The streaming enabler 112b may output the streaming address SA to the data streamer 210b together with the streaming signal STR. When the command CMD is a data read command, the streaming address SA may include a plurality of addresses at which the first data to be read has been stored. The streaming address SA may be the first one of the plurality of addresses at which the first data has been stored.

The memory device 20b may include the data streamer 210b, a memory cell array 220b, the data information register 230b, a status register 240b, and a control logic 250b. The data streamer 210b, the memory cell array 220b, the data information register 230b, the status register 240b, and the control logic 250b may be the same as or similar to the data streamer 210, the memory cell array 220, the data information register 230, the status register 240, and the control logic 250 shown in FIG. 2, and thus repeated descriptions thereof will be omitted for conciseness.

Figure 12:
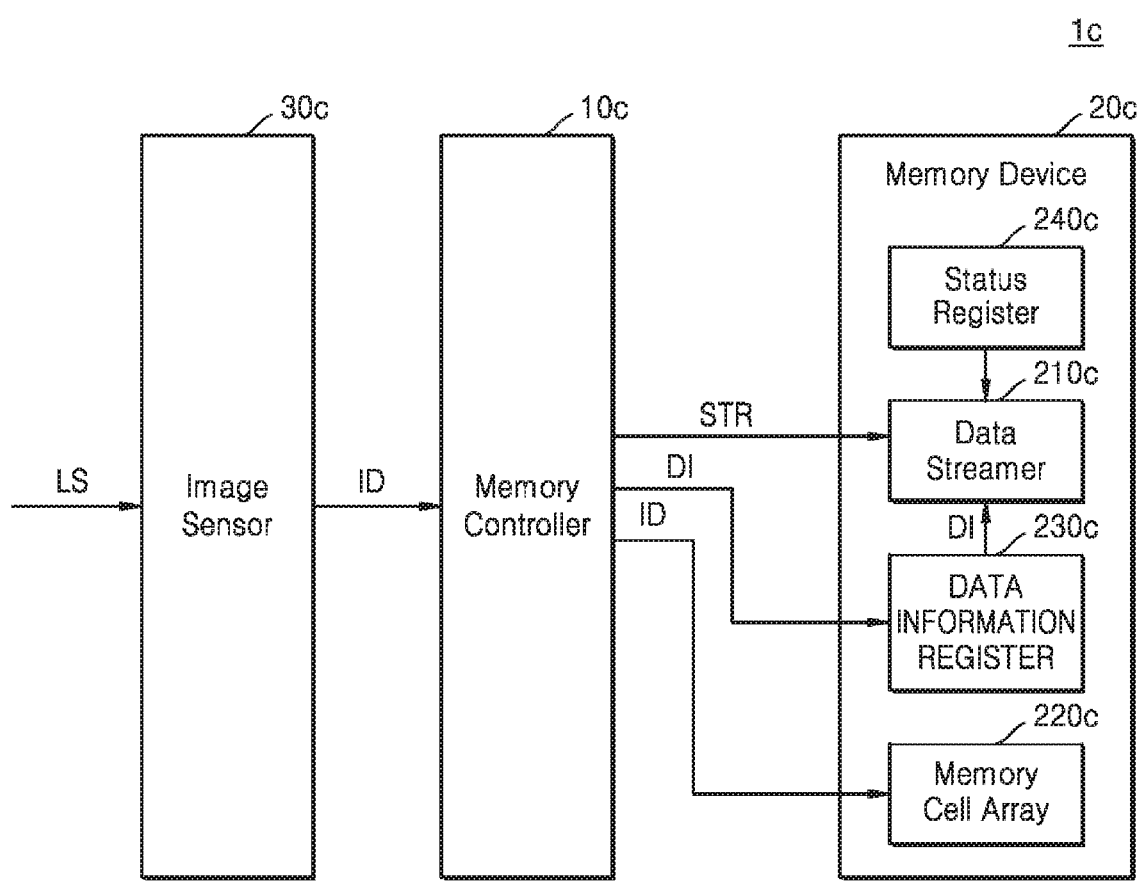
FIG. 12 is a block diagram of an image processing apparatus according to some example embodiments.

FIG. 12 is a block diagram of an image processing apparatus according to some example embodiments. Redundant descriptions that have been made with reference to FIG. 2 will be omitted for conciseness.

Referring to FIG. 12, an image processing apparatus 1c may include an image sensor 30c, a memory controller 10c, and a memory device 20c. The memory device 20c may include a data streamer 210c, a memory cell array 220c, a data information register 230c, and a status register 240c. The memory controller 10c, the data streamer 210c, the memory cell array 220c, the data information register 230c, and the status register 240c may be the same as or similar to the memory controller 10, the data streamer 210, the memory cell array 220, the data information register 230, the status register 240, and the control logic 250 shown in FIG. 2, and thus redundant descriptions will be omitted for conciseness.

The image sensor 30c may sense an optical signal LS of an object captured through a lens, convert the intensity of sensed light into image data ID in digital form, and output the image data ID to the memory device 20c through an image processor or the like. The image sensor 30c may be a charge-coupled device (CCD) image sensor or a complementary metal-oxide semiconductor (CMOS) image sensor (CIS). The image sensor 30c may output the image data ID to the memory controller 10c so that the image data ID may be written. The memory controller 10c may store the data information DI of the image data ID in the data information register 230c and may output the streaming signal STR for writing the image data ID to the data streamer 210c. The image processing apparatus 1c may be implemented as a stack CIS in which the memory device 20c and the image sensor 30c are vertically stacked.

The data streamer 210c may perform a streaming operation based on the data information DI of the image data ID, thereby storing the image data ID in the memory cell array 220c. Since the image data ID is deterministic data, data I/O may be performed in the streaming operation.

Figure 13:
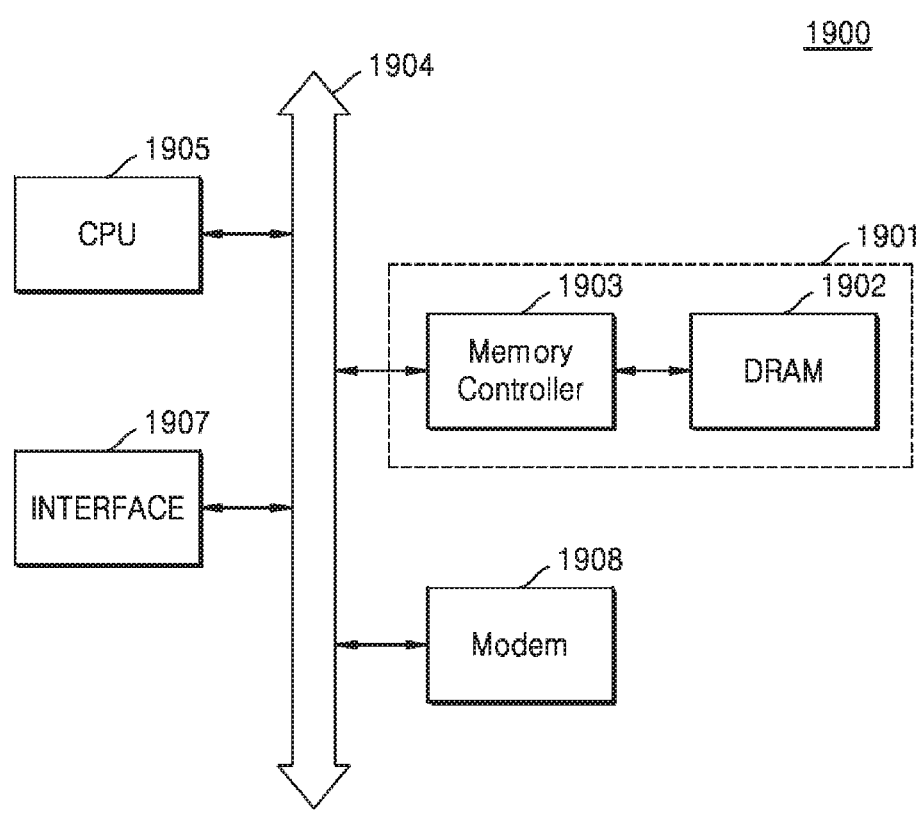
FIG. 13 is a block diagram of a computer system according to some example embodiments.

FIG. 13 is a block diagram of a computer system according to some example embodiments.

Referring to FIG. 13, a computer system 1900 may be installed in a mobile device, a desktop computer, or the like. The computer system 1900 may include a DRAM system 1901, a central processing unit (CPU) 1905, an interface 1907, and a modem 1908 such as a baseband chipset, which are electrically connected to a system bus 1904. The computer system 1900 may be further provided with an application chipset, a camera image processor (CIS), an I/O device, etc.

The interface 1907 may transmit data to a communication network or receive data from a communication network. The interface 1907 may be wired or wireless and may include an antenna or a wired or wireless transceiver. Data which has been provided through the interface 1907 or the modem 1908 or processed by the CPU 1905 may be stored in the DRAM system 1901.

The DRAM system 1901 may include any memory system described above with reference to FIGS. 1 through 12. The DRAM system 1901 may include DRAM 1902 and a memory controller 1903. Data processed by the CPU 1905 or externally input data is stored in the DRAM 1902. When the DRAM 1902 receives a streaming command from the CPU 1905 or the like, the DRAM 1902 may internally generate by the DRAM 1902 at least one signal among a RAS signal, a CAS signal, and a precharge signal, without a normal drive command from the memory controller 1903, and may write data to or read data from a memory cell array.

In a case where the computer system 1900 performs wireless communication, the computer system 1900 may be used in a communication system such as a code division multiple access (CDMA) system, a global system for mobile communication (GSM), a North American digital cellular (NADC) system, or a CDMA2000 system. The computer system 1900 may be installed in an information processing device such as a personal digital assistant (PDA), a portable computer, a web tablet, a digital camera, a portable media player (PMP), a mobile phone, a wireless phone, or a laptop computer.

While example embodiments been particularly shown and described, it will be understood that various changes in form and details may be made therein without departing from the spirit and scope of the following claims.

What is claimed is:

1. A memory device comprising:
   a memory cell array comprising a plurality of memory cells;
   a control logic configured to output a control signal for data reading or data writing to the memory cell array; and
   a data streamer configured to perform a streaming operation for reading data from or writing data to the memory cell array in response to a streaming signal from a memory controller,
   wherein the data streamer is further configured to receive data size information of first data to be read or written and perform the streaming operation by outputting at least one streaming drive command to the control logic based on the data size information,
   wherein the data streamer comprises:
   a state manager configured to determine a type and a number of the at least one streaming drive command based on the data size information in response to the streaming signal received from outside of the memory device and configured to output the at least one streaming drive command to the control logic, the at least one streaming drive command being for reading or writing the first data;
   an address manager configured to determine an address based on the data size information, the address being for reading or writing the first data; and
   a timing manager configured to control output timing of the at least one streaming drive command and to count the number of the at least one streaming drive command.

2. The memory device of claim 1, wherein the first data is deterministic data of which a format and a size do not vary with an external command that is external to the memory device.

3. The memory device of claim 1, wherein the first data is at least one among image data, audio data, and video data.

4. The memory device of claim 1, further comprising a data information register configured to store the data size information.

5. The memory device of claim 1, wherein the state manager is further configured to differently determine the number of the at least one streaming drive command according to the data size information.

6. The memory device of claim 1, wherein the at least one streaming drive command comprises at least one signal among a row address strobe signal for driving the plurality of memory cells row by row, a column address strobe signal for driving the plurality of memory cells column by column, and a precharge signal for precharging the plurality of memory cells.

7. The memory device of claim 1, further comprising a status register configured to store available address information of an available address corresponding to a memory cell that does not store valid data among the plurality of memory cells.

8. The memory device of claim 7, wherein the address manager is further configured to, in a write streaming operation, receive the available address information from the status register and determine a write address for writing of the first data based on the available address information and the data size information.

9. The memory device of claim 1, wherein the address manager is further configured to, in a read streaming operation, receive a start address corresponding to a first one of a plurality of addresses of the memory cell array in which the first data has been stored and determine a read address for reading of the first data based on the start address and the data size information.

10. The memory device of claim 1, further comprising a mode register configured to receive a mode command from outside the memory device and to set an operating mode of the memory device in response to the mode command,
    wherein the streaming signal is included in the mode command.

11. The memory device of claim 1, further comprising a command address generator configured to generate a command and an address for a read or write operation on the memory cell array,
    wherein the data streamer is further configured to generate a state signal comprising state information about a state for the read or write operation, the state information being generated based on the data size information, and outputs the state signal to the command address generator, and
    the command address generator is further configured to generate, based on the state information, at least one signal among a row address strobe signal for driving the plurality of memory cells row by row, a column address strobe signal for driving the plurality of memory cells column by column, and a precharge signal for precharging the plurality of memory cells, and output the at least one signal to the control logic.

12. The memory device of claim 1, further comprising a multiplexer configured to receive, from outside of the memory device, at least one normal drive command for reading or writing the first data and to selectively output the at least one normal drive command and the at least one streaming drive command to the control logic according to a mode selection signal of the state manager.

13. The memory device of claim 12, wherein the state manager is further configured to determine a number of total drive commands in the at least one normal drive command and the at least one streaming drive command based on the data size information, the total drive commands being for writing or reading the first data, and output the mode selection signal to the multiplexer based on the number of the total drive commands that are determined by the state manager.

14. The memory device of claim 1, wherein the memory device is a volatile memory device.

15. The memory device of claim 1, wherein the memory device is Dynamic Random Access Memory (DRAM).

16. The memory device of claim 1, wherein the state manager is further configured to:
    sequentially enter an active state, a read/write state, and a precharge state,
    output a row address strobe signal to drive the plurality of memory cells row by row in the active state, output a column address strobe signal to write data to or read data from the plurality of memory cells in the read/write state, and output a precharge signal to precharge the plurality of memory cells in the precharge state.

17. A memory system comprising:

a memory controller configured to output data size information of first data and a streaming signal; and a memory device comprising a memory cell array and a control logic configured to output a control signal for data reading or data writing to the memory cell array, wherein the memory device further comprises a data streamer configured to perform a streaming operation for reading data from or writing data to the memory cell array in response to the streaming signal from the memory controller, wherein the data streamer is further configured to receive the data size information of the first data to be read or written and perform the streaming operation by outputting at least one streaming drive command to the control logic based on the data size information, wherein the data streamer comprises:

a state manager configured to determine a type and a number of the at least one streaming drive command based on the data size information in response to the streaming signal received from outside of the memory device and configured to output the at least one streaming drive command to the control logic, the at least one streaming drive command being for reading or writing the first data;

an address manager configured to determine an address based on the data size information, the address being for reading or writing the first data; and a timing manager configured to control output timing of the at least one streaming drive command and to count the number of the at least one streaming drive command.

18. The memory system of claim 17, wherein the memory controller comprises a streaming manager configured to output the data size information of the first data to the memory device when the first data is deterministic data of which a format and a size do not vary with an external command from outside of the memory controller.

19. The memory system of claim 18, wherein the streaming manager comprises:

a data information generator configured to generate the data size information based on the first data; and a streaming enabler configured to output, to the memory device, the streaming signal for performing the streaming operation.

20. The memory system of claim 18, wherein the streaming manager is further configured to:

output the streaming signal and the data size information to the memory device when the first data is written, and output the streaming signal, the data size information, and a start address to the memory device when the first data is read, the start address corresponding to a first one of a plurality of addresses at which the first data has been stored.

* * * * *